US012581627B2

(12) United States Patent
Shiraichi

(10) Patent No.: US 12,581,627 B2
(45) Date of Patent: Mar. 17, 2026

(54) DEVICE WITH A MICROWAVE SHIELDING CONTAINER

(71) Applicant: SHARP KABUSHIKI KAISHA, Sakai City (JP)

(72) Inventor: Yukishige Shiraichi, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 30 days.

(21) Appl. No.: 18/709,719

(22) PCT Filed: Nov. 14, 2022

(86) PCT No.: PCT/JP2022/042156
§ 371 (c)(1),
(2) Date: May 13, 2024

(87) PCT Pub. No.: WO2023/090276
PCT Pub. Date: May 25, 2023

(65) Prior Publication Data
US 2025/0008712 A1 Jan. 2, 2025

(30) Foreign Application Priority Data

Nov. 19, 2021 (JP) ................................ 2021-188290
Jun. 24, 2022 (JP) ................................ 2022-101466

(51) Int. Cl.
*H05K 9/00* (2006.01)
(52) U.S. Cl.
CPC ......... *H05K 9/0056* (2013.01); *H05K 9/0015* (2013.01)

(58) Field of Classification Search
CPC .................................................. H05K 9/0056
See application file for complete search history.

(56) References Cited

U.S. PATENT DOCUMENTS 5,206,478 A * 4/1993 Lee ........................ H05B 6/763
174/382

FOREIGN PATENT DOCUMENTS

| JP | H01303038 | A | 12/1989 |
| JP | H07248187 | A | 9/1995 |
| JP | H07318067 | A | 12/1995 |
| JP | 2003-262465 | A | 9/2003 |

* cited by examiner

*Primary Examiner* — Hung V Ngo
(74) *Attorney, Agent, or Firm* — ScienBiziP, P.C.

(57) ABSTRACT

The purpose of the present disclosure is to provide a device in which a microwave-blocking container is provided inside a vacuum container, and which makes it possible to more easily and more definitively block microwaves. A device according to the present disclosure is equipped with a housing, a vacuum container provided inside the housing, and a microwave-blocking container which accommodates an object to be treated and is provided inside the vacuum container, and is characterized in that the microwave-blocking container has a microwave radiation part and an opening which blocks microwaves and allows a gas inside the microwave-blocking container to flow into the vacuum container.

10 Claims, 14 Drawing Sheets

FIG. 11

DEVICE WITH A MICROWAVE SHIELDING CONTAINER

TECHNICAL FIELD

The present disclosure relates to a device. The present application claims priority from Japanese Patent Application No. 2021-188290 filed in Japan on Nov. 19, 2021 and Japanese Patent Application No. 2022-101466 filed in Japan on Jun. 24, 2022, the contents of which are incorporated herein by reference.

BACKGROUND ART

Conventionally, a device that heats an object to be treated with microwaves has been disclosed.

For example, in a device (vacuum dryer) in Patent Literature 1, a vacuum container 3 is provided in a dielectric heating device 1, and a pipe 33 connected to a vacuum pump passes through a hole 12 and is connected to the vacuum container 3. The object to be treated is accommodated in the vacuum container and subjected to drying treatment by decompression and dielectric heating with microwaves.

Furthermore, in a device (decompression high-frequency heating device) in Patent Literature 2, a sealed container 3 serves as both a vacuum container and a microwave shielding container, and a waveguide 7 connected to a magnetron 6 is connected to the sealed container, and an exhaust pipe 10a connected to a vacuum pump 12 is connected to the sealed container. An object 2 to be heated is accommodated in the sealed container 3, and is treated by decompression and dielectric heating with microwaves.

The devices according to Patent Literatures 1 and 2 are configured such that the vacuum container is accommodated in the dielectric heating device or one sealed container serves as both the vacuum container and the microwave shielding container.

CITATION LIST

Patent Literatures

Patent Literature 1: JP 2003-262465 A
Patent Literature 2: JP H07-318067 A

SUMMARY

Technical Problem

However, in the above devices, a vacuum hose connected to the vacuum pump needs to pass through a wall of the container that acts as a microwave shield, but a diameter of the vacuum hose is basically thick (basically about 20 mm or more), and it is difficult to shield microwaves from the through hole. Furthermore, since generation of water vapor exceeding the treatment capability of the vacuum pump or the like hinders decompression or the like in the vacuum container, it is preferable to suppress an amount of water vapor in the vacuum container.

Therefore, in view of the above problems, an object of the present disclosure is to provide a device in which a microwave shielding container is provided in a vacuum container, and shielding of microwaves can be more reliably and easily performed. Furthermore, another object of the present disclosure is to provide a device capable of suppressing an amount of water vapor in a vacuum container.

Solution to Problem

An aspect of the present disclosure is characterized by including: a housing; a vacuum container provided in the housing; and a microwave shielding container provided in the vacuum container and accommodating an object to be treated, in which the microwave shielding container includes a microwave radiation part and an opening configured to shield microwaves and allow gas in the microwave shielding container to flow to the vacuum container.

Advantageous Effects of Disclosure

As described above, according to the present disclosure, it is possible to provide a device capable of more reliably and easily shielding microwaves by providing a microwave shielding container in a vacuum container. Furthermore, it is possible to provide a device capable of suppressing an amount of water vapor in the vacuum container.

BRIEF DESCRIPTION OF DRAWINGS

FIG. 11 is a side view schematically illustrating the device according to the third embodiment, and is a view illustrating the device during decompression.

DESCRIPTION OF EMBODIMENTS

Hereinafter, preferred embodiments of the present disclosure will be described in detail with reference to the drawings. Note that the present embodiment described below does not unreasonably limit the contents of the present disclosure described in the claims, and all the configurations described in the present embodiments are not necessarily essential as solutions of the present disclosure.

First Embodiment

Figure 1:
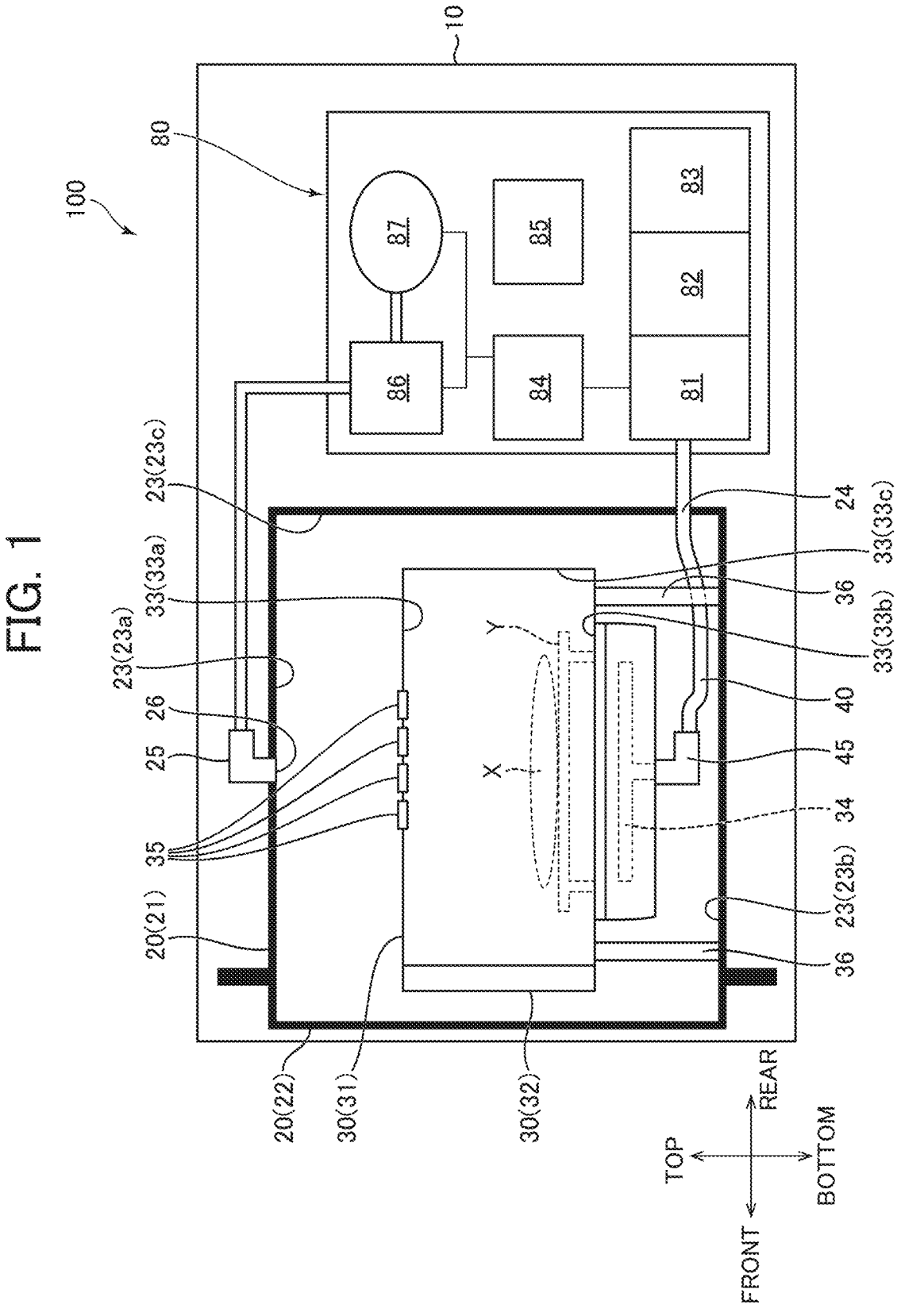
FIG. 1 is a side view schematically illustrating a device according to a first embodiment.

FIG. 1 is a side view schematically illustrating a device 100 according to a first embodiment. As illustrated in FIG. 1, the device 100 according to the first embodiment includes a housing 10, a vacuum container 20, and a microwave shielding container 30. Examples of the device 100 according to the first embodiment and devices 200, 300, 400, and 500 according to embodiments to be described later include a vacuum dryer, a microwave heating device, a thawer or a microwave heating device with enhanced thawing quality, a decompression cooker, and the like.

The vacuum container 20 and the microwave shielding container 30 are provided in the housing 10. Furthermore, an accessory 80 for operating the device 100 is provided in the housing 10.

The accessory 80 includes a high frequency oscillation circuit 81, a heat sink 82, a cooling fan 83, a control circuit 84, a power supply 85, a cold trap 86, a vacuum pump 87, and the like.

The vacuum container 20 is provided in the housing 10 and includes a main body 21 of the vacuum container 20 and a lid part 22 of the vacuum container 20. Furthermore, the vacuum container 20 and the accessory 80 are connected by a connection tube 25, and the inside of the vacuum container 20 is decompressed through the connection tube 25.

The microwave shielding container 30 is provided in the vacuum container 20, shields microwaves, and accommodates an object to be treated X. Note that the object to be treated X may be placed on a table Y. The microwave shielding container 30 includes a main body 31 of the microwave shielding container 30 and a door part 32 of the microwave shielding container 30. Furthermore, the microwave shielding container 30 includes a microwave radiation part 34 and openings 35. Note that the microwave shielding container 30 may include legs 36 to support the vacuum container 20 and the microwave shielding container 30.

As illustrated in FIG. 1, the microwave radiation part 34 may be provided on a lower wall 33b of the microwave shielding container 30 so as to irradiate microwaves from a bottom to a top.

The microwave radiation part 34 radiates microwaves. The microwave radiation part 34 may be a magnetron including a vacuum tube as a microwave source. Microwaves output from the magnetron are radiated into the metal-shielded microwave shielding container 30. Furthermore, as illustrated in FIG. 1, the microwave radiation part 34 may be provided below the microwave shielding container 30. In such a case, the microwaves are irradiated from the bottom to the top.

The microwave source is preferably a gallium nitride (GaN) semiconductor. In this way, a patch antenna used in a wireless device can be used for the object to be treated X in the microwave shielding container 30. Furthermore, by adopting a system in which the microwave radiation part 34 (patch antenna) and the object to be treated X are combined at 1 wavelength or less, the energy of the microwaves can be efficiently transmitted to a heating part, and the device can also be downsized. Moreover, since a microwave source made of a gallium nitride (GaN) semiconductor is smaller than a magnetron, a plurality of microwave sources can be attached to one device. Selective heating in which only a specific microwave source irradiates microwaves, uniform heating in which all sources simultaneously irradiate microwaves, and the like can be performed.

Each of the openings 35 allows the gas in the microwave shielding container 30 to flow to the vacuum container 20. Furthermore, the opening 35 shields microwaves. A plurality of the openings 35 are formed by small punched holes or the like so as not to leak microwaves. As the vacuum pump 87 operates, the gas in the microwave shielding container 30 is discharged from each of the openings 35 to the outside of the microwave shielding container 30. Furthermore, the openings 35 may be provided on a plurality of walls 33 of the microwave shielding container 30, for example, an upper wall 33a of the microwave shielding container 30 as illustrated in FIG. 1. Moreover, the openings 35 may be provided in the vicinity of the object to be treated X and an exhaust port 26 of the vacuum container 20.

Radiation of microwaves accompanying the operation of the high frequency oscillation circuit 81 is performed only in the microwave shielding container 30, and the microwaves do not leak into a space between the vacuum container 20 and the microwave shielding container 30. The object to be treated X placed in the microwave shielding container 30 is treated by decompression and dielectric heating with microwaves.

According to the device 100 according to the above-described first embodiment, by providing the microwave shielding container 30 in the vacuum container 20, it is not necessary to cause a vacuum hose to penetrate the walls 33 of the microwave shielding container 30, and thus, it is possible to more reliably and easily shield the microwave. Furthermore, in view of the influence of microwaves, it is difficult to use a metal component for a part of the vacuum container (for example, a connector portion for a vacuum hose), and it is difficult to increase a degree of vacuum (degree of sealing). However, according to the device 100 according to the first embodiment described above, the sealability of the vacuum container can be secured more reliably and easily.

Furthermore, according to the device 100 according to the first embodiment, the high frequency oscillation circuit can be provided outside the vacuum container. As a result, the internal volume of the microwave shielding container 30, that is, the volume on which the object to be treated X can be placed can be made larger than the volume of the vacuum container 20. Furthermore, it is not necessary to consider the influence of the magnetron or the oscillation circuit on the high-frequency transmitter in the vacuum environment.

Furthermore, the device 100 according to the first embodiment further includes a cable 40. The cable 40 extends from the microwave radiation part 34 via a connection member 45 and penetrates a penetrated portion 24 of a wall 23 of the vacuum container 20, and has flexibility. Furthermore, the cable 40 extending from the microwave radiation part 34 penetrates the penetrated portion 24 and is connected to the high frequency oscillation circuit 81. In this way, since the vacuum container 20 is not affected by microwaves, a member suitable for securing the degree of vacuum, such as a metal connector, can be used for the penetrated portion 24.

The penetrated portion 24 may be sealed with a sealing material. In this way, the sealing material can avoid the influence of heating or the like due to the influence of the microwaves as much as possible, and can ensure the sealability relatively easily and reliably.

Furthermore, if the cable 40 has flexibility, an arrangement of the microwave radiation part 34 can be easily changed as described later. Furthermore, if the cable 40 has flexibility, the sealability of the vacuum container 20 is easily maintained.

As illustrated in FIG. 1, the penetrated portion 24 is provided on a rear wall 23c of the vacuum container 20, but may be provided on an upper wall 23a of the vacuum container 20 and a lower wall 23b of the vacuum container 20.

Figure 2:
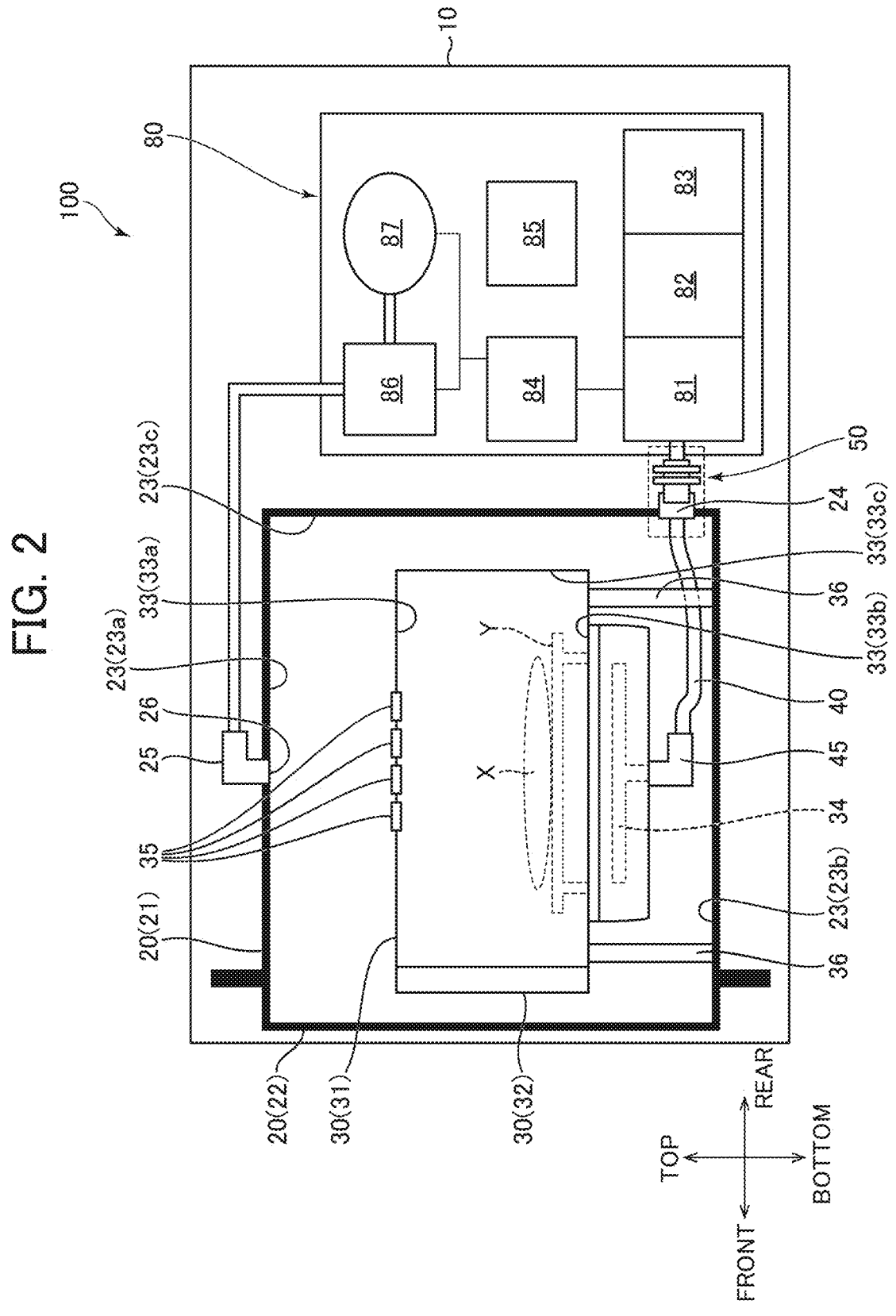
FIG. 2 is a side view schematically illustrating the device according to the first embodiment.

FIG. 2 is a side view schematically illustrating the device 100 according to the first embodiment. As illustrated in FIG. 2, the device 100 according to the first embodiment preferably further includes a vacuum sealing member 50. The vacuum sealing member 50 is a member that is provided in the penetrated portion 24, seals the vacuum container 20, and holds or adjusts the degree of vacuum in the vacuum container 20.

As illustrated in FIG. 2, the vacuum sealing member 50 may be provided outside the vacuum container 20 or inside the vacuum container 20. By providing the vacuum sealing member 50 inside the vacuum container 20, work can be performed from the same front side as the loading and unloading of the object to be treated X, and the maintenance of the sealability by the vacuum sealing member 50 can be easily checked.

Figure 3:
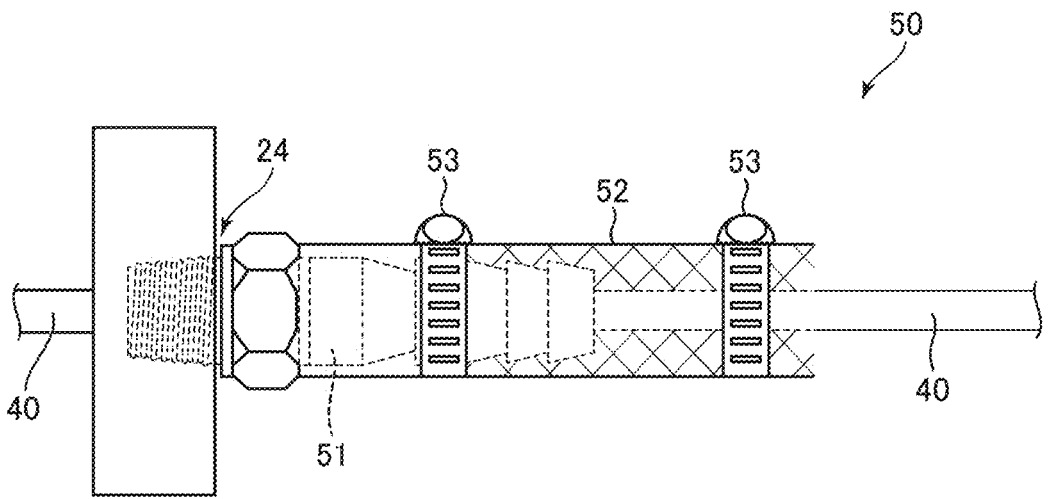
FIG. 3 is an enlarged view of a vacuum sealing member illustrated in FIG. 2.

FIG. 3 is an enlarged view of the vacuum sealing member 50 illustrated in FIG. 2. As a specific example in which the degree of sealing can be adjusted by the vacuum sealing member 50, as illustrated in FIGS. 2 and 3, the vacuum sealing member 50 preferably includes a nipple 51 through which the cable 40 is inserted, a vacuum hose 52 provided outside the nipple 51, and a hose band 53 for fixing the nipple 51 and the vacuum hose 52. In this way, since the hose band 53 or the like can be detachably attached by loosening the fastening, maintenance such as replacement of the cable 40 can be more easily performed, and high sealability can be secured.

Figure 4:
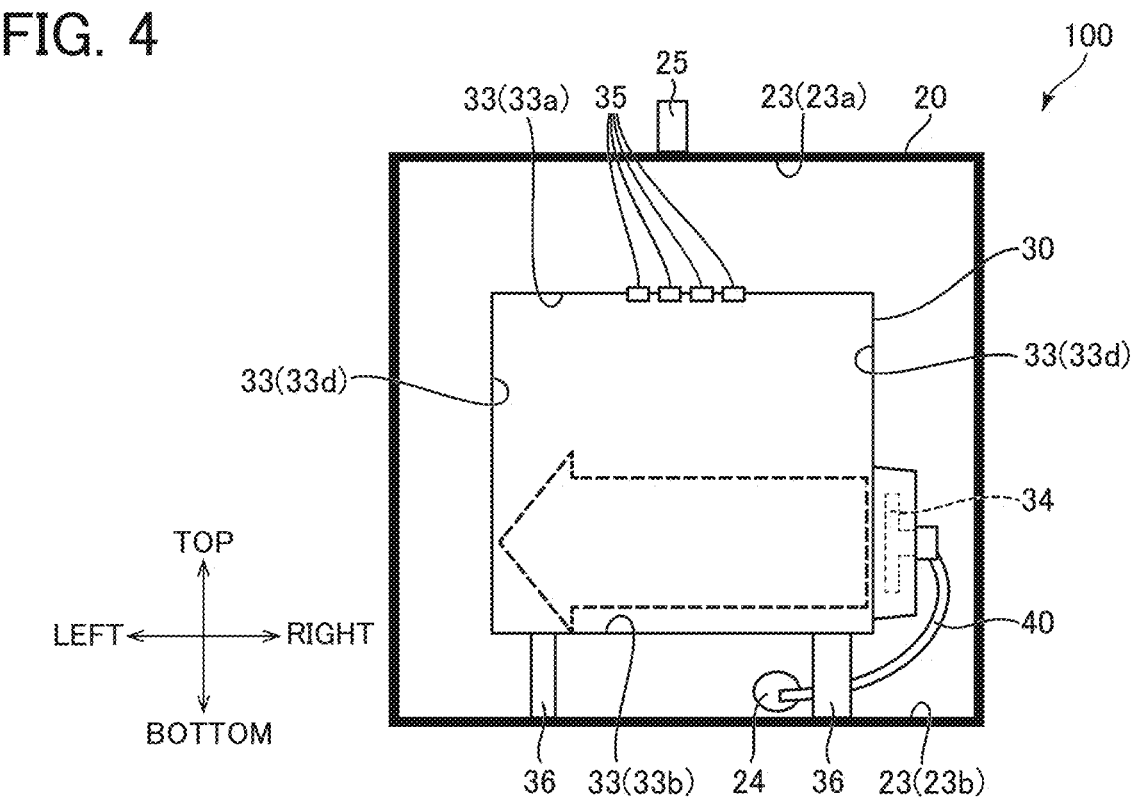
FIG. 4 is a front view schematically illustrating the device according to the first embodiment.
Figure 5:
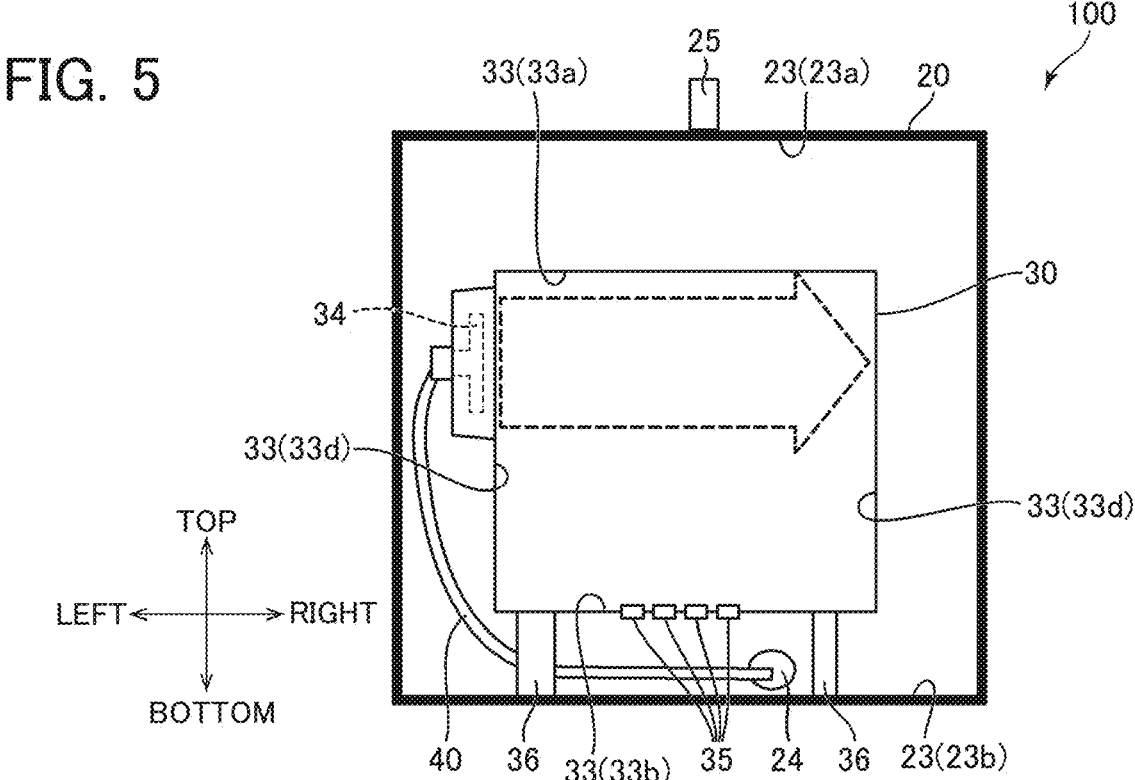
FIG. 5 is a side view schematically illustrating a modification of the device according to the first embodiment.

FIG. 4 is a front view schematically illustrating the device 100 according to the first embodiment, and is a view of the lid part 22 of the vacuum container 20 of FIG. 1 as viewed from the front. In FIG. 4 and FIG. 5 described later, illustration of the housing 10 and the like is omitted. Arrows in the microwave shielding container 30 indicate directions in which microwaves are irradiated, and in FIG. 4, the direction is from right to left. In FIG. 5, the direction in which the microwave is irradiated is from left to right. As illustrated in FIG. 4, the microwave radiation part 34 may be provided on a side wall 33d of the microwave shielding container 30 and below the center so as to irradiate microwaves in the left-right direction of the microwave shielding container 30. In this way, a lower portion of the microwave shielding container 30 can be selectively heated.

On the other hand, as illustrated in FIG. 5, the microwave radiation part 34 may be provided on a side wall 33d of the microwave shielding container 30 and above the center so as to irradiate microwaves in the left-right direction of the microwave shielding container 30. In this way, an upper portion of the microwave shielding container 30 can be selectively heated.

By arranging the microwave radiation part 34 as illustrated in FIGS. 4 and 5 in this manner, the irradiation direction of the microwaves can be changed, and the object to be treated X can be selectively heated. Furthermore, if the cable 40 has flexibility, the arrangement and irradiation direction of the microwave radiation part 34 can be easily changed, and the object to be treated X can be selectively heated.

In FIGS. 4 and 5, the microwave radiation part 34 is provided on the side wall 33d of the microwave shielding container 30, but may be provided on the upper wall 33a of the microwave shielding container 30. In this way, an upper portion of the microwave shielding container 30 can be selectively heated.

Second Embodiment

Figure 6:
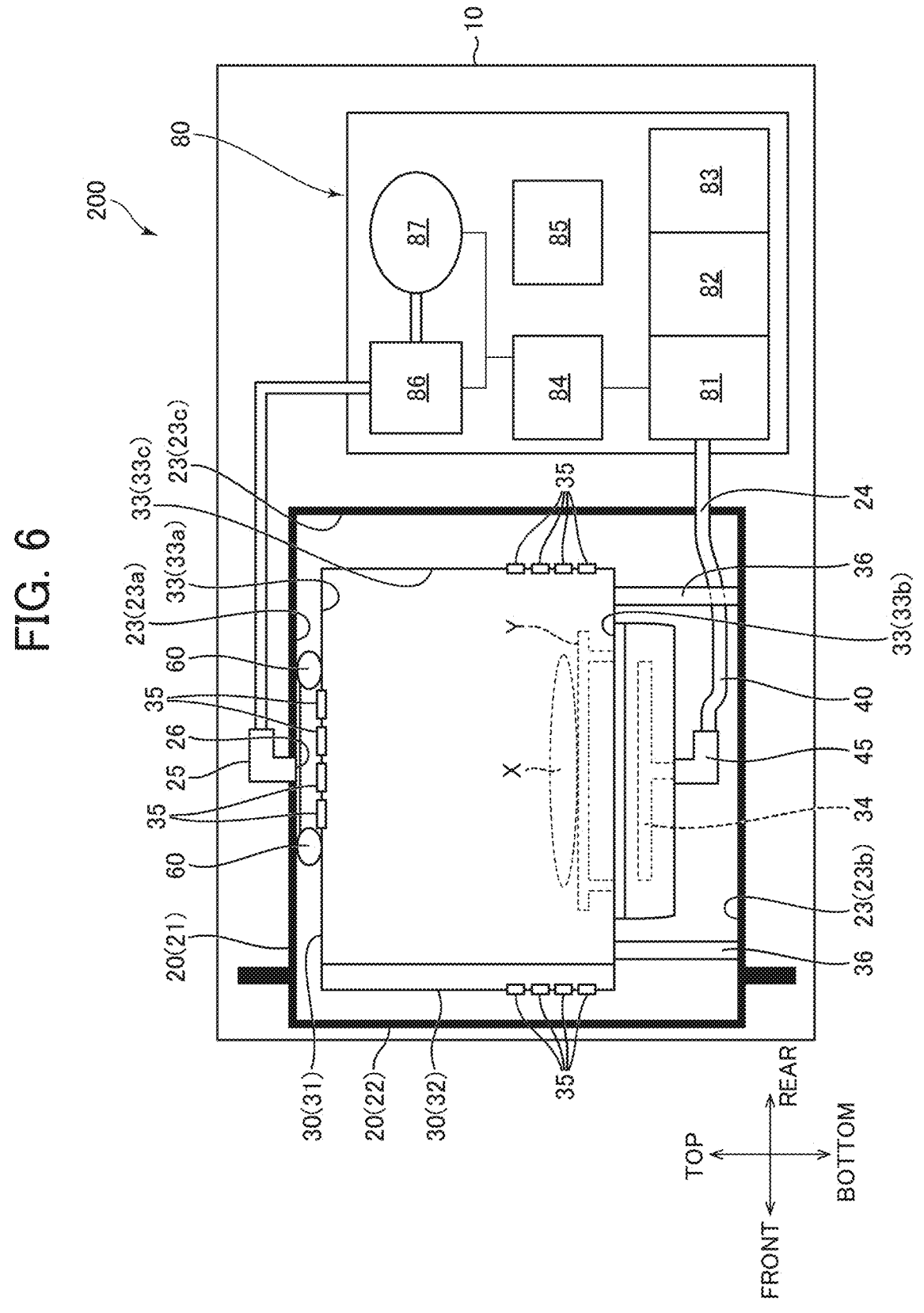
FIG. 6 is a side view schematically illustrating a device according to a second embodiment.

FIG. 6 is a side view schematically illustrating a device 200 according to a second embodiment. As illustrated in FIG. 6, a ring-shaped (O-ring) packing 60 such as a rubber packing may be provided between a vacuum container 20 and a microwave shielding container 30 in the vicinity of an exhaust port 26 of the vacuum container 20 so that the air in the microwave shielding container 30 can be directly exhausted. In this way, the air in the microwave shielding container 30 can be directly exhausted, so that the vaporized material released from an object to be treated X can be efficiently discharged, and the object to be treated X can be more uniformly heated.

Figure 7:
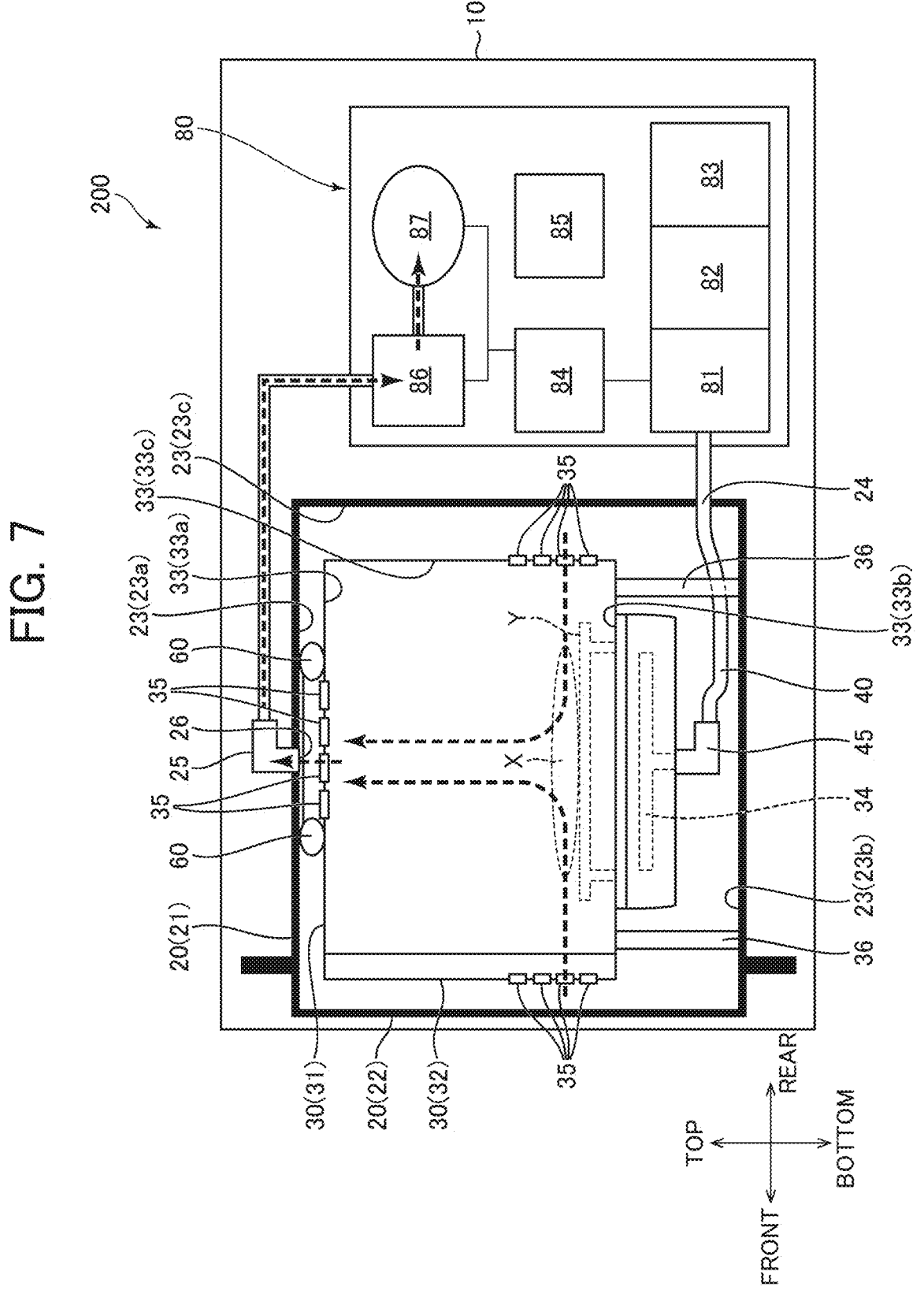
FIG. 7 is a side view schematically illustrating the device according to the second embodiment, and is a view illustrating a flow of gas during depressurization.

Furthermore, as illustrated in FIG. 6, openings 35 may be further provided in a door part 32 of the microwave shielding container 30. The openings 35 may be further provided on a rear wall 33c of the microwave shielding container 30 and/or a side wall 33d of the microwave shielding container 30. In this way, the gas flows as indicated by the arrows in FIG. 7, and the gas flows near the object to be treated X, so that the vaporized material released from the object to be treated X can be efficiently discharged, and the object to be treated X can be more uniformly heated.

Third Embodiment

Figure 8:
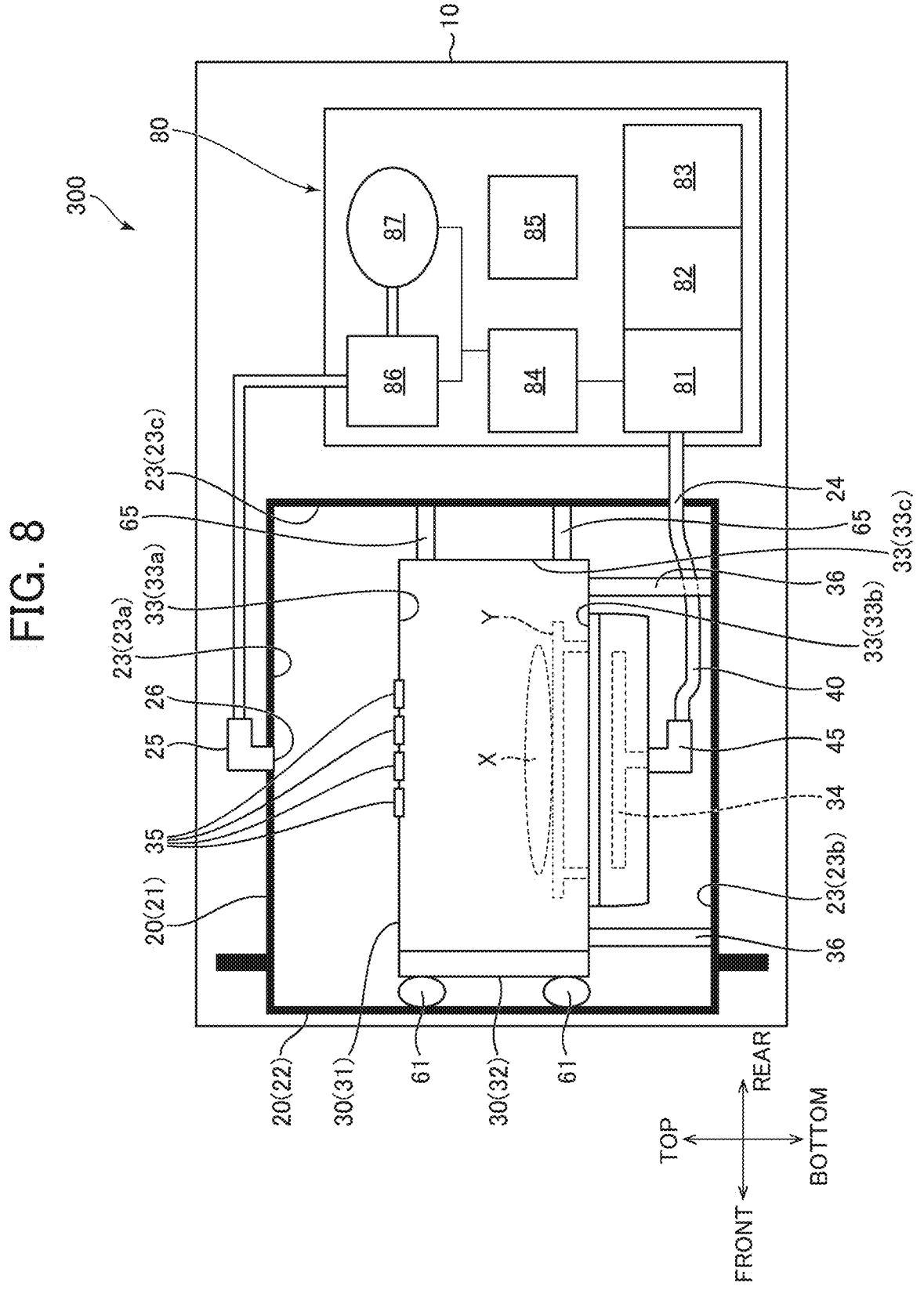
FIG. 8 is a side view schematically illustrating a device according to a third embodiment.
Figure 9:
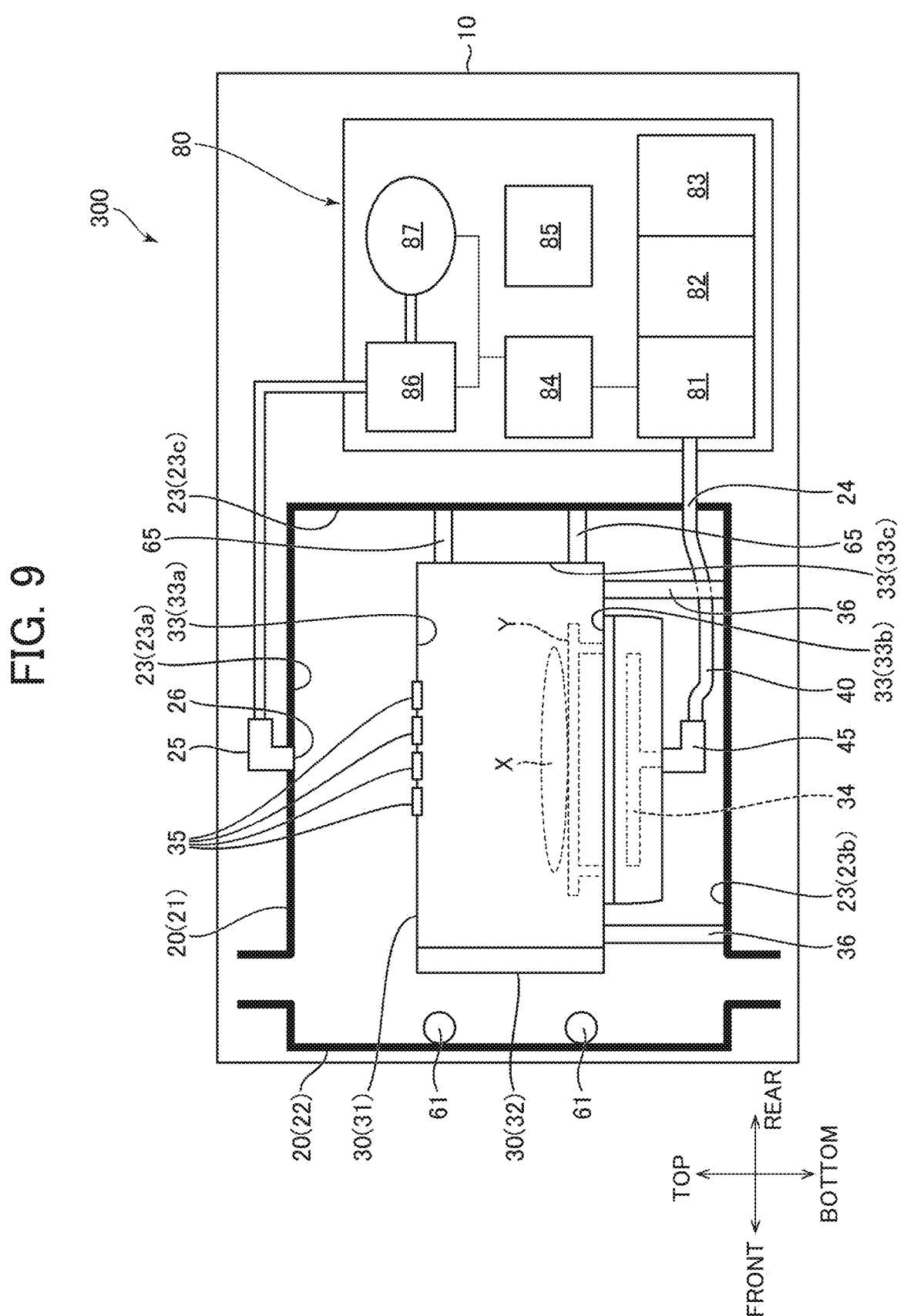
FIG. 9 is a side view schematically illustrating the device according to the third embodiment in a state where a lid part of a vacuum container is opened.
Figure 10:
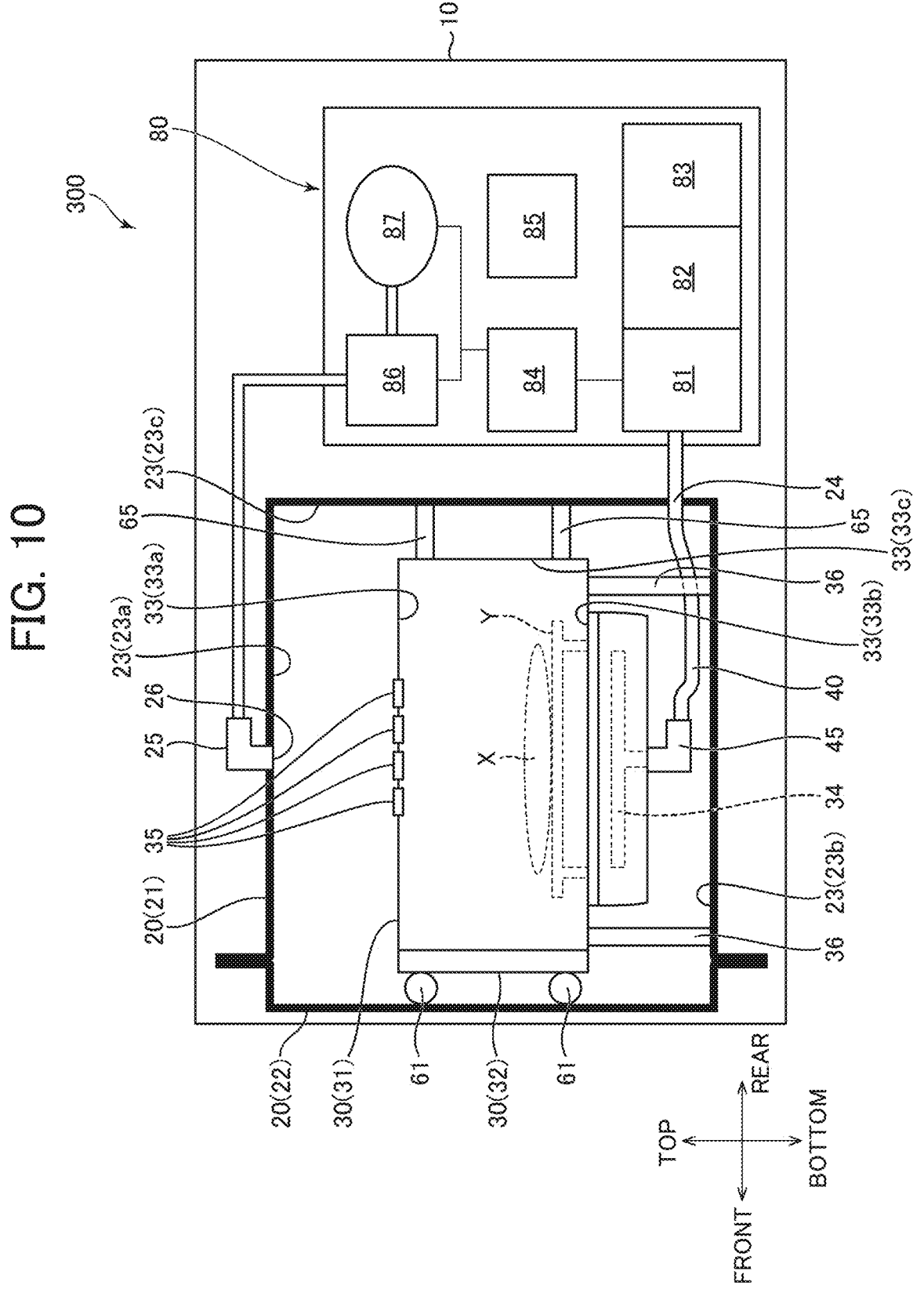
FIG. 10 is a side view schematically illustrating the device according to the third embodiment, and is a view illustrating the device before decompression.
Figure 11:
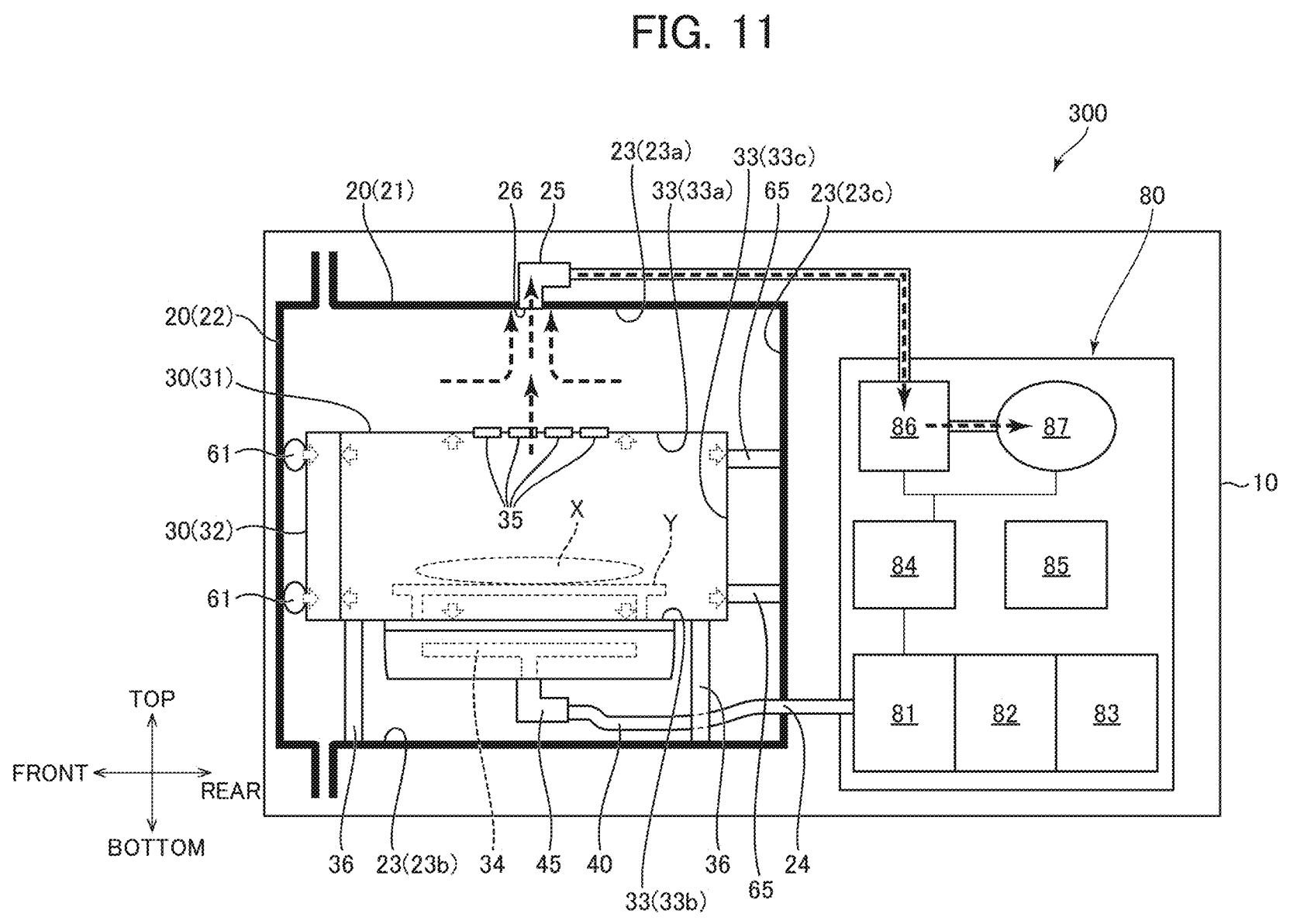

FIG. 8 is a side view schematically illustrating a device 300 according to a third embodiment. FIG. 9 is a side view schematically illustrating the device 300 according to the third embodiment in a state where a lid part 22 of a vacuum container 20 is opened. FIG. 10 is a side view schematically illustrating the device 300 according to the third embodiment, and is a view illustrating the device 300 before decompression. FIG. 11 is a side view schematically illustrating the device 300 according to the third embodiment, and is a view illustrating during decompression. Arrows in FIG. 11 indicate pressures. As illustrated in FIGS. 8 to 11, a pressing member 61 that presses a door part 32 is provided between a lid part 22 of a vacuum container 20 and the door part 32 of a microwave shielding container 30. Furthermore, a support member 65 that supports the microwave shielding container 30 and the vacuum container 20 is provided on a side opposite to a position of the door part 32.

As illustrated in FIGS. 8 to 11, when the vacuum container 20 is decompressed, the gas from the microwave shielding container 30 flows from openings 35. Therefore, a pressure difference is generated between the outside and the inside of the microwave shielding container 30 due to a difference in decompression speed, and the pressure in an opening direction acts on the door part 32. However, with the above configuration, the door part 32 of the microwave shielding container 30 is pressed by the lid part 22 of the vacuum container 20 and the support member 65 via the pressing member 61, and the leakage of the microwaves from the microwave shielding container 30 can be suppressed.

The pressing member 61 preferably has a hollow structure, and the inside of the hollow structure is preferably at an atmospheric pressure higher than a decompression pressure of the vacuum container 20.

In this way, the pressing member 61 expands due to the expansion of the gas in the hollow structure accompanying the decompression, and a force for pressing the door part 32 of the microwave shielding container 30 acts, whereby the sealability of the microwave shielding container 30 can be further enhanced. Therefore, the shielding property against microwave leakage from the microwave shielding container 30 can be further enhanced.

Fourth Embodiment

Figure 12:
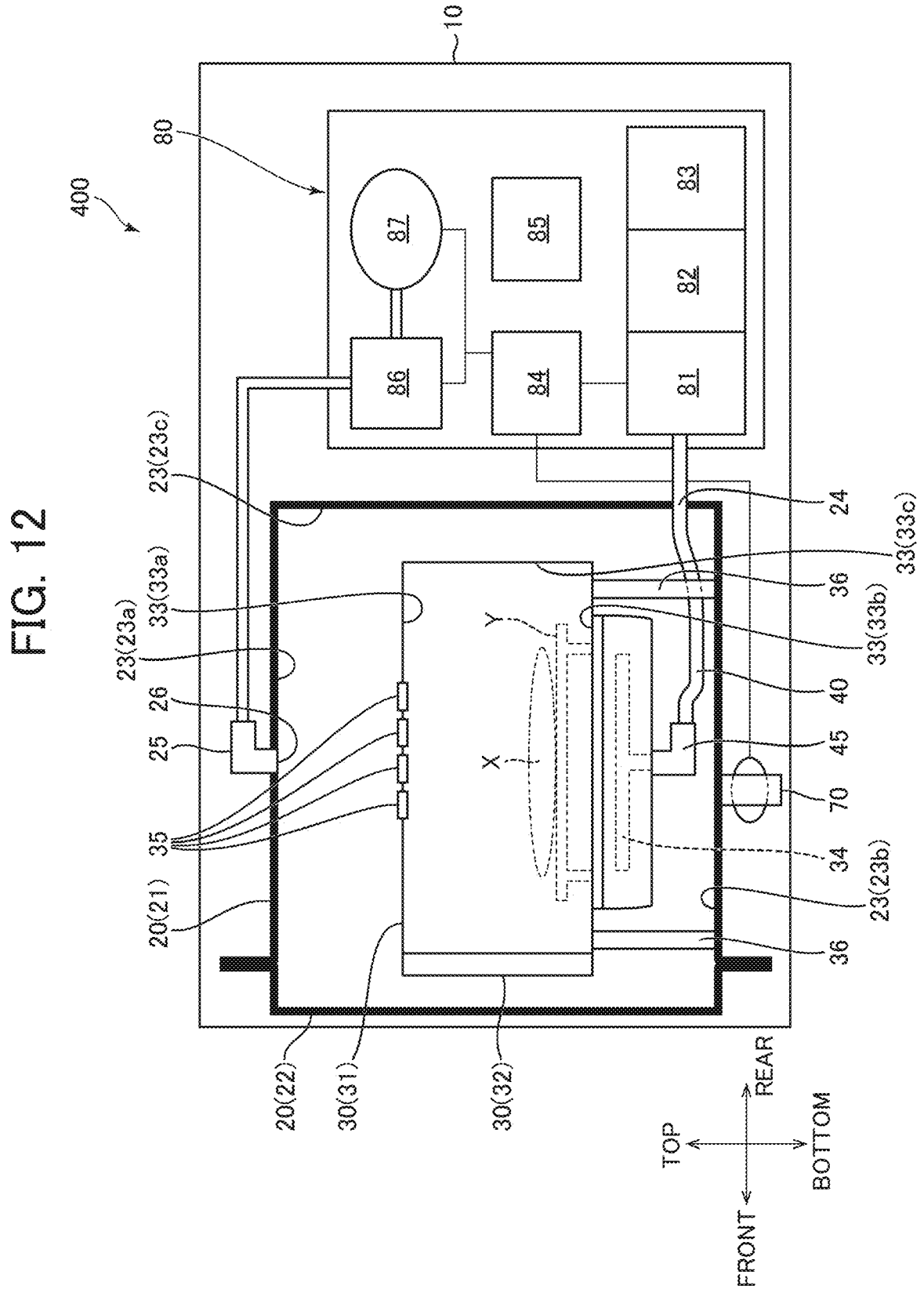
FIG. 12 is a side view schematically illustrating a device according to a fourth embodiment.
Figure 13:
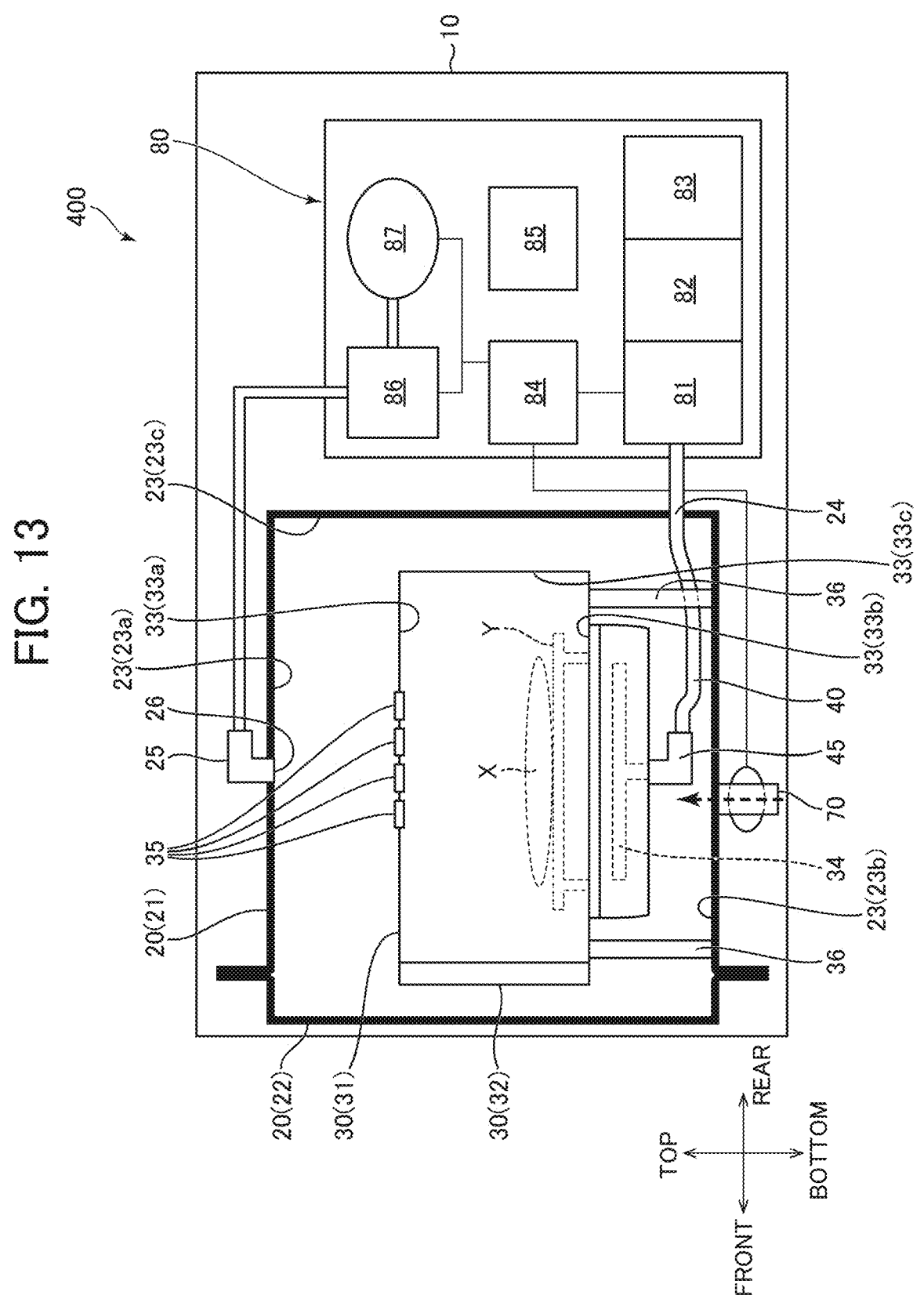
FIG. 13 is a side view schematically illustrating a device according to a fourth embodiment, and is a view in which a cooling on-off valve is opened for cooling.

FIG. 12 is a side view schematically illustrating a device 400 according to a fourth embodiment. FIG. 13 is a side view schematically illustrating the device 400 according to the fourth embodiment, and is a view in which a cooling on-off valve 70 is opened for cooling. Arrows illustrated in FIG. 13 indicate the flow of gas. As illustrated in FIGS. 12 and 13, a cooling on-off valve 70 for cooling a microwave radiation part 34 is provided on a surface of a wall 23 of a vacuum container 20 near the microwave radiation part 34. The cooling on-off valve 70 is preferably provided on any one or more of an upper wall 23a, a lower wall 23b, and a rear wall 23c of the vacuum container 20, and is preferably provided around the microwave radiation part 34.

In this way, for example, when overheating occurs around the microwave radiation part 34 due to abnormal discharge or the like around the microwave radiation part 34, the microwave radiation part 34 can be cooled urgently. Furthermore, at the end of the operation of the device 400, it is possible to simultaneously cool a portion around the microwave radiation part 34 that tends to have a high temperature when air is introduced into the vacuum container 20.

The cooling on-off valve may be opened and closed by an electromagnetic means or the like in accordance with an instruction signal from the control circuit 84.

Fifth Embodiment

The generation of water vapor exceeding the processing capacity of a vacuum pump or a cold trap hinders the decompression in the vacuum container, and may cause clogging due to dew condensation in a vacuum hose. Therefore, it is desirable to have a means for suppressing an amount of water vapor upstream of a suction opening of the vacuum hose. Furthermore, conventionally, a vacuum container is accommodated in a microwave shielding container, or one sealed container serves as both a vacuum container and a microwave shielding container. As a problem in such a configuration, since microwaves are irradiated to the entire inner region of the vacuum container when an object to be treated is heated, in a case where water vapor generated from the object to be treated and filling the vacuum container is temporarily recovered in the vacuum container, there is a problem that water cannot be recovered as desired by being heated by microwaves even if an adsorbent such as silica gel is installed. Furthermore, there is also a method of stopping and controlling heating so as not to cause excessive generation of water vapor, but in this case, there is a problem that the treatment time of the object to be treated becomes long. Therefore, according to a device 500 according to a fifth embodiment, an amount of water vapor in a vacuum container 20 can be suppressed. Details will be described below.

Figure 14:
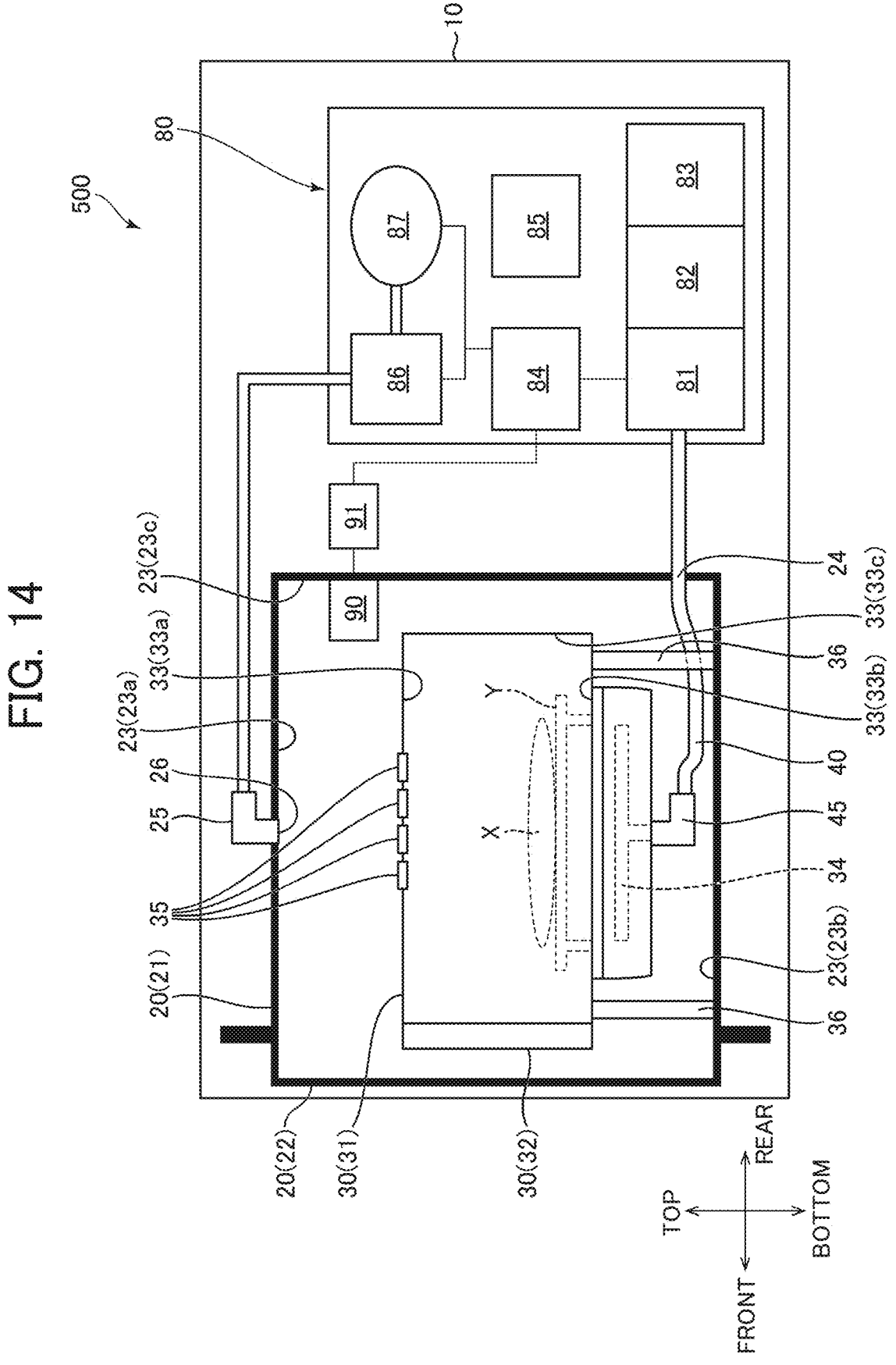
FIG. 14 is a side view schematically illustrating a device according to a fifth embodiment.

FIG. 14 is a side view schematically illustrating the device 500 according to the fifth embodiment. As illustrated in FIG. 14, the device 500 according to the fifth embodiment further includes a recovery unit 90 that recovers moisture contained in air in the vacuum container 20 inside the vacuum container 20 and outside the microwave shielding container 30.

Examples of the recovery unit 90 include a heat exchanger used on a heat absorbing side of a heat pump cycle. The recovery unit 90 such as a heat exchanger condenses the volatilized moisture at a temperature lower than the ambient temperature to recover the moisture in the vacuum container 20. The recovery unit 90 may further include, for example, a dish-like component for storing condensed moisture, a sponge-like component for capturing water by surface tension, or the like. Furthermore, in addition to the recovery unit 90 such as a heat exchanger, an adjustment unit 91 is further provided outside the vacuum container 20. The adjustment unit 91 includes, for example, a compressor, a condenser, and a heat radiation-side heat exchanger constituting a heat pump cycle. The recovery unit 90 and the adjustment unit 91 are connected to penetrate a wall of the vacuum container 20. The recovery unit 90 operates as a cooling-side heat exchanger of the heat pump cycle, and the adjustment unit 91 operates as a heat radiation-side heat exchanger, whereby moisture can be recovered from water vapor in the vacuum container 20. Note that, in the adjustment unit 91, a control circuit 84 performs operation control such as start and stop of operation and adjustment of output.

In this way, the water vapor filled in the vacuum container 20 can be recovered in the vacuum container 20 by the recovery unit 90, and the moisture recovered by the microwave is not heated, so that revolatilization of the recovered moisture can be avoided. Therefore, it is possible to reduce the influence caused by the processing capacity of a vacuum pump 87 and a cold trap 86 without suppressing a dehydration rate of the object to be treated which is an advantage of using the microwave.

Furthermore, the adjustment unit 91 further includes a mechanism for reversely operating heat absorption and heat dissipation of the heat pump cycle, such as a four-way valve. The recovery unit 90 operates as a heat radiation-side heat exchanger of the heat pump cycle, and the adjustment unit 91 operates as a cooling-side heat exchanger. As a result, moisture recovered by the recovery unit 90 can be released again to the vacuum container 20.

In this way, the moisture once recovered in the vacuum container 20 is re-released within a range of the processing capacity of the vacuum pump 87 and the cold trap 86, and the moisture is recovered in the cold trap 86 or released from the vacuum pump 87 to the outside air. As a result, moisture does not stay in the vacuum container 20, so that it is possible to avoid moisture re-adsorption to the object to be treated as much as possible within the time from the completion of the drying treatment of the object to be treated to the removal of the object to be treated.

Furthermore, a Peltier element may be used as the cooling-side heat exchanger of the recovery unit 90. In such a case, it is preferable to provide a part of the Peltier element on a low temperature side in the vacuum container 20 and a part of the Peltier element on a high temperature side outside the vacuum container 20. In a case where the Peltier element is used, the adjustment unit 91 is, for example, a power supply device that supplies power to the Peltier element, and the control circuit 84 performs operation control such as start and stop of operation and adjustment of output. Alternatively, the adjustment unit 91 may be omitted, and the control circuit 84 and a power supply 85 may be connected to the Peltier element constituting the recovery unit 90 to perform operation control such as adjustment.

Figure 15:
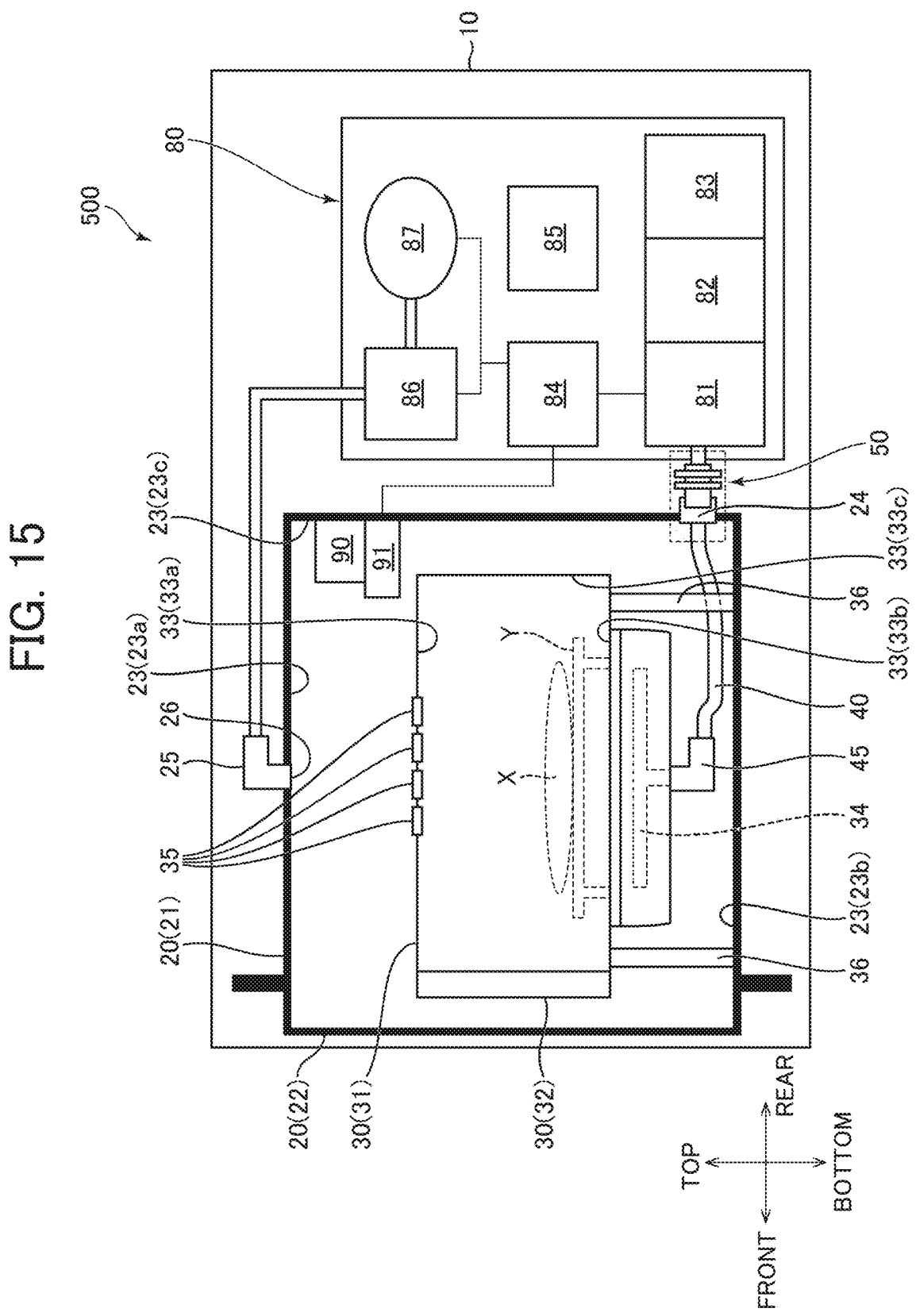
FIG. 15 is a side view schematically illustrating a modification of the device according to the fifth embodiment.

Furthermore, FIG. 15 is a side view schematically illustrating a modification of the device 500 according to the fifth embodiment. A device 500 illustrated in FIG. 15 also further includes a recovery unit 90 that recovers moisture contained in air in a vacuum container 20 inside the vacuum container 20 and outside a microwave shielding container 30.

Examples of the recovery unit 90 include silica gel and a moisture-regulating material. The moisture in the vacuum container 20 is absorbed and recovered by the recovery unit 90 such as silica gel or a moisture-regulating material.

The moisture-regulating material has a moisture-regulating function by absorbing or releasing moisture. The moisture-regulating material contains a water-absorbing material containing a resin and/or a clay mineral, and a moisture-regulating liquid that is a moisture-regulating component that absorbs or releases moisture and has a moisture-regulating function. A water-absorbing material is impregnated with the moisture-regulating liquid. The moisture-regulating material absorbs moisture contained in the air at the place and absorbs moisture, or releases moisture contained in the moisture-regulating material into the air and humidifies the air according to the humidity of the environment in which the moisture-regulating material is placed. Note that the moisture-regulating liquid may be impregnated not only in the water-absorbing material but also in a carrier that carries the moisture-regulating material. A shape of the moisture-regulating material may be a powder, a particle, or a block, or may be efficiently brought into contact with air by carrying a resin on a permeable base material.

The water-absorbing material is preferably a water-absorbent resin (particles, powder). In this way, the water-absorbing material can be suitably impregnated with the moisture-regulating liquid, and the moisture-regulating effect can be further enhanced. Specific examples of the water-absorbent resin material are preferably an ionic resin and a nonionic resin. Examples of the ionic resin include an alkali metal salt of polyacrylic acid and a starch-acrylate graft polymer. Specific examples of the alkali metal salt of polyacrylic acid include sodium polyacrylate. Examples of the nonionic resin include a vinyl acetate copolymer, a maleic anhydride copolymer, polyvinyl alcohol, and polyalkylene oxide.

The moisture-regulating liquid preferably contains at least one selected from the group consisting of a deliquescent substance that absorbs moisture in the air and deliquesces, and a polyhydric alcohol. In this way, the moisture-regulating effect can be further enhanced.

Note that the "moisture-regulating" means that the relative humidity is adjusted so as to approach a predetermined humidity zone. Specifically, for example, assuming that 50% RH is a predetermined relative humidity, when the relative humidity is higher than 50% RH, the moisture-regulating material absorbs moisture (moisture absorption), and when the relative humidity is lower than 50% RH, the moisture-regulating material releases moisture (moisture release). Usually, the predetermined relative humidity zone correlates with the material and moisture content of the moisture-regulating material. Specifically, for example, the predetermined relative humidity zone correlates with the moisture content in the moisture-regulating liquid.

Furthermore, in addition to the recovery unit 90 such as silica gel, a moisture-regulating material, it is preferable to further include an adjustment unit 91 in the vacuum container 20. Examples of the adjustment unit 91 include a heating device such as a heater. The recovery unit 90 and the adjustment unit 91 are provided in the vacuum container 20. The moisture is recovered by the recovery unit 90 such as silica gel or a moisture-regulating material, and the moisture in the recovery unit 90 is released by the adjustment unit 91 such as a heater. The recovery unit 90 is capable of dissipating moisture in addition to taking in moisture. Note that the adjustment unit 91 may adjust the output by the control circuit 84.

In this way, the moisture once recovered in the vacuum container 20 is re-released within a range of the processing capacity of the vacuum pump 87 and the cold trap 86, and the moisture is recovered in the cold trap 86 or released from the vacuum pump 87 to the outside air. As a result, moisture does not stay in the vacuum container 20, so that it is possible to avoid moisture re-adsorption to the object to be treated as much as possible within the time from the completion of the drying treatment of the object to be treated to the removal of the object to be treated.

As described above, according to the devices 100, 200, 300, 400, and 500 of the present disclosure, by providing the microwave shielding container 30 in the vacuum container 20, it is possible to more reliably and easily shield microwaves. Furthermore, it is possible to provide a device capable of suppressing an amount of water vapor in the vacuum container 20.

Note that, although the embodiments and examples of the present disclosure have been described in detail as described above, those skilled in the art will easily understand that many modifications can be made without departing from the novel matters and effects of the present disclosure. Therefore, all such modifications are included in the scope of the present disclosure.

For example, a term described at least once in the specification or the drawings together with a different term that is broader or synonymous can be replaced with the different term anywhere in the specification or the drawings. Furthermore, the configuration and operation of the device are not limited to those described in each embodiment and each example of the present disclosure, and various modifications can be made.

The invention claimed is:

1. A device comprising:
a housing;
a vacuum container provided in the housing; and
a microwave shielding container provided in the vacuum container and accommodating an object to be treated, wherein
the microwave shielding container includes a microwave radiation part and an opening configured to shield microwaves and to allow gas in the microwave shielding container to flow toward the vacuum container,
the device further comprising a flexible cable extending from the microwave radiation part and penetrating a penetrated portion of a wall of the vacuum container,
wherein the vacuum container is sealed by a vacuum sealing member provided in the penetrated portion.

2. The device according to claim 1, wherein the vacuum sealing member is further provided inside the vacuum container.

3. The device according to claim 1, wherein the opening is provided on a plurality of walls of the microwave shielding container, and near the object to be treated and an exhaust port of the vacuum container.

4. The device according to claim 1, wherein the opening is provided in a door part of the microwave shielding container.

5. The device according to claim 1, wherein a cooling on-off valve configured to cool the microwave radiation part is provided on a wall surface of the vacuum container near the microwave radiation part.

6. The device according to claim 1, wherein the vacuum sealing member is provided such that a degree of sealing is adjustable.

7. The device according to claim 1, wherein:

the vacuum sealing member includes a nipple through which the flexible cable is inserted, a vacuum hose is provided outside the nipple, and a hose band configured to fix the nipple and the vacuum hose.

8. A device comprising:

a housing;

a vacuum container provided in the housing;

a microwave shielding container provided in the vacuum container and accommodating an object to be treated;

a pressing member configured to press a door part of the microwave shielding container between a lid part of the vacuum container and the door part; and a support member configured to support the microwave shielding container and the vacuum container on a side opposite the door part, wherein the microwave shielding container includes a microwave radiation part and an opening configured to shield microwaves and to allow gas in the microwave shielding container to flow toward the vacuum container.

9. The device according to claim 8, wherein the pressing member has a hollow structure, and an inside of the hollow structure is at an atmospheric pressure higher than a decompression pressure of the vacuum container.

10. A device comprising:

a housing;

a vacuum container provided in the housing;

a microwave shielding container provided in the vacuum container and accommodating an object to be treated; and a recovery unit that recovers moisture, that is contained in air, in the vacuum container, inside the vacuum container, and outside the microwave shielding container, wherein the microwave shielding container includes a microwave radiation part and an opening configured to shield microwaves and to allow gas in the microwave shielding container to flow toward the vacuum container.

\* \* \* \* \*